(12) United States Patent
Pawluk

(10) Patent No.: US 10,141,731 B2
(45) Date of Patent: Nov. 27, 2018

(54) MULTI LEVEL CABLE BUS SYSTEM WITH MODULAR CABLE TRAYS

(71) Applicant: Robert R Pawluk, Toronto (CA)

(72) Inventor: Robert R Pawluk, Toronto (CA)

( * ) Notice: Subject to any disclaimer, the term of this patent is extended or adjusted under 35 U.S.C. 154(b) by 165 days.

(21) Appl. No.: 15/402,595

(22) Filed: Jan. 10, 2017

(65) Prior Publication Data

US 2017/0149228 A1      May 25, 2017

Related U.S. Application Data

(63) Continuation-in-part of application No. 12/929,671, filed on Feb. 8, 2011, now Pat. No. 8,558,112, and a
(Continued)

(30) Foreign Application Priority Data

Nov. 4, 2010   (CA) ...................................... 2720146

(51) Int. Cl.
  *H02G 3/04*     (2006.01)
  *H02G 9/06*     (2006.01)
  *H05K 7/20*     (2006.01)

(52) U.S. Cl.
  CPC ............ *H02G 9/06* (2013.01); *H02G 3/0437* (2013.01); *H02G 3/0487* (2013.01); *H05K 7/20136* (2013.01)

(58) Field of Classification Search
  CPC .......... H02G 3/03; H02G 3/0437; H02G 3/02; H02G 3/00; H02G 3/0456; H02G 9/08;
(Continued)

(56) References Cited

U.S. PATENT DOCUMENTS 594,998 A * 12/1897 Lyle .......................... F16L 9/22
                                                              174/72 R
4,376,230 A    3/1983 Bargsten
(Continued)

OTHER PUBLICATIONS

MP Husky USA—Website product catalogue—http://www.mphusky.com/—pp. 1 to 3—circa 2008—USA.
(Continued)

*Primary Examiner* — Angel R Estrada

(57) ABSTRACT

A cable bus system for the mounting and positioning of high amperature, from low to high voltage electrical power cables transmitting polyphase electrical current. The cable bus system included a ventilated enclosure used to protect electrical cables mounted therein. The enclosure is provided with multiple modular cable trays which are bolted together in a stacked arrangement to form a single multi-level cable raceway. The enclosure is further provided with ventilated top and bottom covers which are secured respectively to the top and bottom of the uppermost and bottom most cable trays to define the enclosed metal circuit. The cable bus system is capable of transmitting the same highest allowable "free air" cable amperature in both above and underground installations, effectively improving the transmission of electrical power from one end to the other end, in installations where a transition of electrical power from below ground to above ground is either necessary or economically preferable. For the underground portion, the cable bus is installed in the encasement that is uniquely offset vented or power cooled to meet the cable high amperage requirements. The cable bus system is also suitable for high vertical rise installations when utilizing anti cable slip mechanism or technique.

24 Claims, 19 Drawing Sheets

Related U.S. Application Data continuation of application No. 14/026,758, filed on Sep. 13, 2013, now Pat. No. 9,059,575, and a continuation of application No. 14/700,374, filed on Apr. 30, 2015, now Pat. No. 9,583,922.

(58) Field of Classification Search
CPC .......... H02G 3/0487; H02B 1/20; H02B 7/08; H05K 7/20136; H05K 7/18; H05K 7/183
USPC ....... 174/72 A, 68.1, 68.3, 72 R, 88 R, 70 C, 174/95, 135, 481; 248/68.1, 56; 385/134, 135; 52/220.1, 220.7
See application file for complete search history.

(56) References Cited

U.S. PATENT DOCUMENTS

| | | | |
|---|---|---|---|
| 5,743,497 A | 4/1998 | Michael | |
| 5,992,802 A | 11/1999 | Campbell | |
| 6,448,497 B1 * | 9/2002 | McCracken | H02G 3/0437 174/72 C |
| 6,706,969 B1 | 3/2004 | Young | |
| 7,939,759 B2 * | 5/2011 | Henry | H02G 3/0431 174/101 |
| 8,058,555 B2 * | 11/2011 | Cardi | H02G 3/0406 174/68.1 |
| 8,193,448 B2 | 6/2012 | Syed | |
| 8,294,030 B2 | 10/2012 | Pollard | |

OTHER PUBLICATIONS

MP Husky USA—Website product catalogue http://www.mphusky.com/cable-bus/bus-components—pp. 1 to 4—circa 2008—USA.
MP Husky USA—Website product catalogue http://www.mphusky.com/cable-tray—pp. 1 to 7—circa 2008—USA.
MP Husky USA—Website product catalogue http://www.mphusky.com/overview—pp. 1 to 7—circa 2008—USA.

* cited by examiner

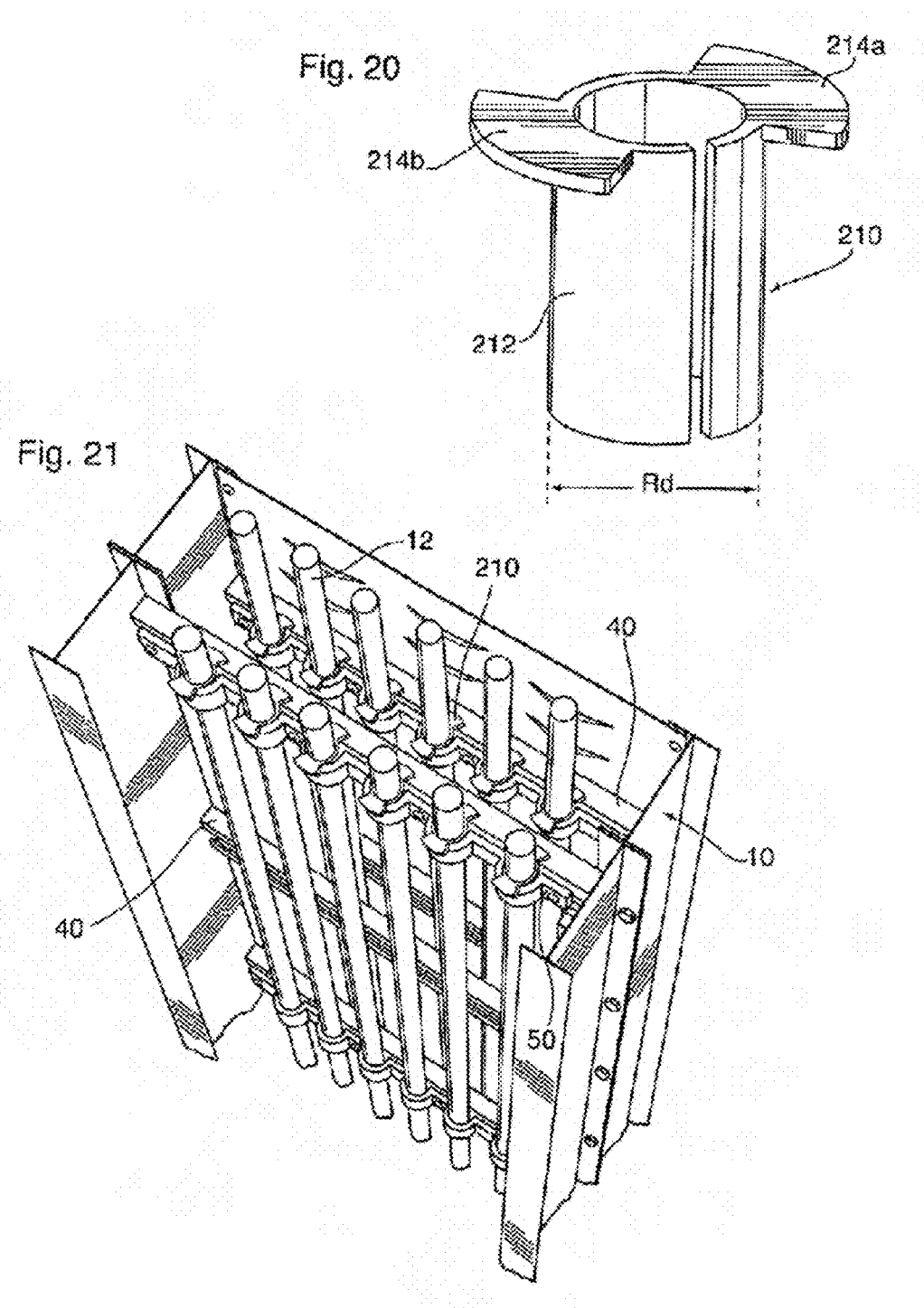

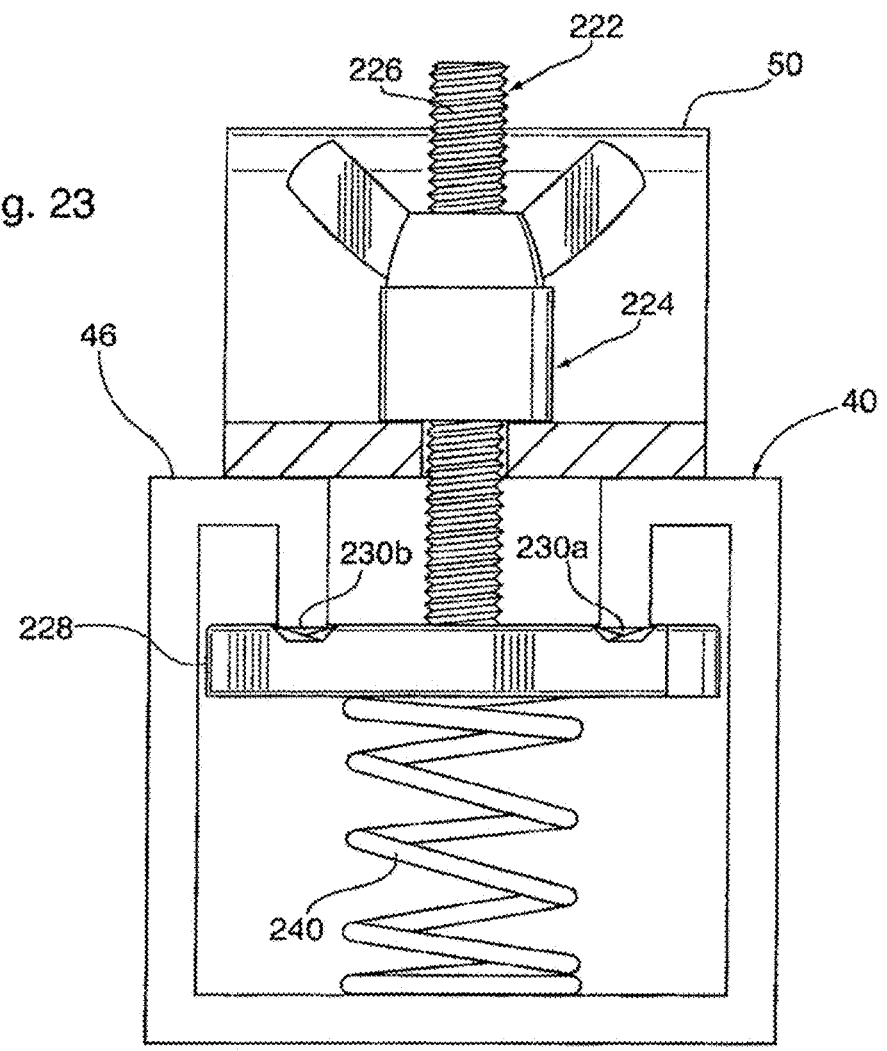

MULTI LEVEL CABLE BUS SYSTEM WITH MODULAR CABLE TRAYS

RELATED APPLICATIONS

This application is a continuation of U.S. patent application Ser. No. 14/700,374, filed 30 Apr. 2015 which is a continuation of U.S. patent application Ser. No. 14/026,758, filed 13 Sep. 2013, now U.S. Pat. No. 9,059,575 B2 and which is a continuation-in-part of U.S. patent application Ser. No. 12/929,671, filed 8 Feb. 2011, now U.S. Pat. No. 8,558,112 B2.

SCOPE OF THE INVENTION

The present invention relates to a cable bus system for use in the distribution of electric power, and more particularly an expandable cable bus system for the distribution and/or transmission of low, medium and high voltage, high amperage, polyphase alternating-current having amperatures ranging up to 8,000 Amps, and/or at voltages of up to 230,000 volts.

BACKGROUND OF THE INVENTION

In power generation and transmission, electrical generator coils or windings are used to produce alternating electric current. To effect the more economical transmission of produced electric current, polyphase transmission systems have been developed. Conventionally, most polyphase power transmission is effected in the form of three-phase power transmission where three alternating currents are produced. Three-phase electrical transmission systems are typically based on a three conductor construction, each conductor used to transfer individual alternating currents which are produced. The alternating currents are generated to reach respective instantaneous peak values at different times, with the second and third currents being delayed respectively by one-third and two-thirds of the current cycle time.

In electrical distribution equipment used to transmit high amperature electrical power from the grid to a load area, the generated polyphase power is supplied by way of electrically insulated stranded conductors or cables when installed near electrical grounds. As the amperature electric current to be delivered increases to higher values, the three conductor constructions become less economical and feasible to use due to the damaging mutual heating of the conductor insulation. Therefore, multiple single conductor cables spaced and strategically positioned apart, are provided for each separate phase as a means to effect equal current sharing, and prevent current varying along any one cable which could otherwise result in overheating. Where such multiple cable delivery systems are provided, it is necessary that the cables are arranged in a parallel format for each phase in a well spaced and oriented manner to avoid electrical current, as well as magnetic field imbalance. The specific cable spacing and orientation varies on an installation-by-installation basis, depending on a number of limitations on current carrying factors, such as the current amperature, cable size, as well as thickness and/or quality of cable conductor insulation.

In an effort to ensure optimal electrical power cable spacing and orientation, various cable bus systems have been developed to provide both mechanical protection and ensure the desired positioning of electrical cables. A prior art cable bus system 6 of the type sold under the name Superior Cable Bus™ by Superior Tray Inc. of British Columbia, Canada and MP Husky™ Cable Bus by MP Husky in Greenville, S.C., are shown in FIG. 1. In such conventional cable bus system 6, a number of electrical cables 12 are housed within a metal enclosure 8. The metal enclosure 8 is provided with parallel spaced C-channel sidewalls 16a,16b which are joined along the top and bottom edges respectively by a ventilated top panel 18 and a bottom panel 20 to define an interior raceway 22.

Along each side of the raceway 22 opposing pairs of C-shaped rails 23 are provided at three foot intervals for each receiving and retaining therein in a series of split blocks 24 which must be locked together using bolts on each side. The split blocks 24 are used to secure the cables 12 in place within the raceway 22, in a sandwiched arrangement. Each split block 24 is formed as a series of chocks 26a,26b,26c which are approximately one inch in thickness. The chocks 26 are provided with a series of pre-drilled holes 28 which are centered along their abutting edges. The holes 28 are sized to receive respective cables 12 therein. The holes 28 are spaced and positioned across the block 24 at multiple levels to receive and support a number of electric cables 12 in a parallel relationship therein.

The applicant has appreciated that various limitations exist with prior art split block cable bus systems 6. In particular, the use of split chocks 26a,26b,26c to support and position electrical cables 12 are both cumbersome and time consuming. In certain cases physical space constraints may prevent the installation of bolts necessary to lock the blocks together. Because it is not technically allowable or feasible to splice the parallel cables in each polyphase used in high amperature cable transmissions systems, it is necessary to physically draw full circuit lengths of cable in each layer of the electrical cables 12 successively over each chock 26a, 26b at the site of installation. Because of the longitudinal length spacing between the sets of split blocks and the varying surface contour of each split block 24, this in turn necessitates the use of labour intensive cable rollers to avoid cable damage, increasing both the time and cost of installation.

In addition, if the outside diameter of the cable insulation layer 13 varies relative to the diameter of preformed holes 28 as a result of manufacturing tolerances, the holes 28 formed in the cable support blocks 24 could be either too loose or too tight for proper cable mounting. The correction of hole sizes is both difficult and costly, if deemed possible, and therefore requires the manufacturing and replacement of the split blocks.

Another disadvantage is that the cables used are normally heavier, larger sized conductors with relatively thin insulation which can be readily ruptured and fail at the three foot interval support locations, as a result of commonly occurring and damaging electrical system fault forces.

Further, the positioning of split blocks 24 at approximate three foot intervals results in the formation of sectionalized compartments along the length of the raceway 22. If ventilation openings in the top panel 18 are inadvertently covered by debris or the like, this disadvantageously may result in localized cable hot spots along the raceway 22 as a result of blockage of required airflow.

More problematic however, if cables 12 at a lower level require removal or replacement as a result of damage or failure, with prior art systems it is necessary to first completely remove and thereafter reinstall all overlying chock blocks 26c,26d and the upper cable layers from the raceway 22 at significantly increased time, cost and difficulty.

Another disadvantage of the prior art of cable bus systems are typically installed above ground level in order to ensure that free flowing air passing through the vented covers dissipates undesirable heat generated by cables away from the enclosure. Heat trapped within the vicinity of the high amperage cables will cause the ambient temperature to rise, causing premature failure of the cable installation or necessitating the substantial derating of the allowable cable amperature, which can become cost prohibitive.

Power cables of varying levels of amperage are commonly installed underground by either underground conduits encased within poured concrete, or alternately directly buried. Due to the slow rates of heat transfer away from the heat generating cables due to a lack of airflow, the amperage of cables installed in such mediums are restricted both technically and by industry standards to approximately one half of that allowable for cables which are continuously cooled by air movement. When a power cable circuit is conventionally installed partially underground with the balance of the circuit installed where there is open airflow, the allowable amperage for the cables in the total circuit length is restricted to the lower underground amperage values resulting in uneconomical installation practices.

SUMMARY OF THE INVENTION

The present invention provides a cable bus system for the mounting and positioning of electrical power cables used to conduct high amperature, polyphase electrical current up to 8,000 Amps. The cable bus system is configured to ensure that electrical impedance along each parallel conductor cable is identical to provide equal current load sharing, while minimizing phase impedance and the generation of cable mutual heating thereby. In the cable bus system, a predetermined number of electrical cables are fixed in position relative to each other to minimize the possibility of excessive heating of cable conductor insulation as a result of the heat generated by the transmission of electricity therealong.

A further object of this invention is to prove an underground cable bus system meets free or forced flowing air requirements necessary to maintain cooling of the power cables and thereby attain the maximum cable amperage throughout the circuit route.

Another object is to provide a subterranean cable transmission assembly in which a cable bus enclosure is provided in an underground encasement composed of concrete or other suitable material, and which is air vented in an offset manner that prevents entry of debris and soil materials into the enclosure at preselected locations along the encasement circuit length.

Another object of the present invention is to provide a cable bus system for use in the orientation of electrical power cables, and which allows for the simplified addition and/or removal of electrical cables as power supply and/or load requirements may change.

Another object of the invention is to provide a cable bus system enclosure for insulated electrical cables used in the transportation and/or transmission of high amperature electrical power, and preferably electrical power at amperatures of up to 8,000 Amps from a source to a load area, and which is constructed to provide for enhanced uninterrupted airflow longitudinally along the enclosure.

Another object of the invention is the use of high temperature power cables in the present invention to achieve a compact, highly efficient power feeder system for critical circuits required to remain in operating condition without failure during emergency fire situations.

Another object of the invention is to provide a cable bus system which incorporates one or more stackable modular metal cable trays for use in the assembly of a multi-layer metal cable enclosure used in the erection of a cable bus or raceway, and which are configured to support a number of electrical power cables at multiple spaced layers, while minimizing electrical impedance, maximizing ventilation of heat generated by current carrying cables and achieving the highest industry allowable free air power cable enable amperage.

A further object of the invention is to provide a cable bus system which is adapted to support electrical cables with minimized risk of cable insulation damage as a result of mechanical stresses at cable/support system contact points.

Another object of the invention is to provide auxiliary anti-slip gripping sleeve or grommet for positioning over the cable outer cover at strategically located cable clamp location in vertical cable bus installations. Although the cables in vertical arrays are usually clamped approximately every two to three feet in vertical installations, there is a high risk of cable slipperage particularly in vertical heights greater than approximate 30 feet due to downward forces exerted by gravitational weight during cable vibration or electrical fault forces. Typically the gripping sleeves are formed of an elastomeric or resiliently compressible material such as rubber Neoprene™ or plastic. Anti-slip gripping sleeves may advantageously serve as both a non-slip connection between the cable, clamp and enclosure cross-brace members and serve to additionally insulate the electrical cable from metallic cable bus support components.

To at least partially achieve some of the aforementioned objects, the present invention provides a cable bus system which includes a ventilated enclosure suitable for use in the protection of unarmoured or armoured electrical cables mounted therein. Although not essential, the enclosure is most preferably provided with a modular design and consisting of one or more multiple single level cable trays which maybe bolted in a stacked arrangement in the formation of a single or multi-level cable raceway. In such an embodiment, the addition or removal of individual cable trays may thus be used in the erection of a larger or smaller capacity cable bus system depending on the power distribution requirements. Further, the use of modular cable trays allows existing cable bus systems to be upgraded in future with ease, allowing the addition of more cables as consumption requirements at a load and/or site may change.

The cable bus system is typically provided with ventilated top and bottom covers which are screwed, bolted or welded respectively to the top and bottom of the uppermost and bottommost cable trays to define the enclosed metal circuit.

In a simplified construction, each metal cable tray includes a pair of longitudinally extending vertical side panels, which are joined in a fixed orientation by a series of transversely extending connecting runs or cross-brace members. The connecting runs are screwed, welded or bolted at each end to a respective side panel and serve as both cross-brace members and a lower support for an associated array of electrical cables resting thereon. In optimum construction, the cross-brace members are provided with a generally flat and smooth uppermost surface which is selected to allow the cables of each associated array to be drawn longitudinally thereacross and along the raceway during straight cable pulling operations, without the requirement of cable support rollers.

One or more clamp members are provided to secure the cables of each array to an upper face of the associated cross-brace member. In one simplified construction, the clamp members may consist of an elongated metal bar which is provided with a series of spaced keepers which are configured for fitted placement over the upper peripheral portion of cables. The clamp members may be secured in a variety of manner, but most preferably are fixed in place by way of screws or bolts, which allows for later removal in the event cable repair and/or replacement may be required in future.

Most preferably, the cross-brace members of each cable tray are longitudinally off-set relative to the cross-brace members of a next, and more preferably each remaining modular tray in the cable bus system. It is to be appreciated that such an offset configuration allows vertical access to each cable array from a topside of the raceway without requiring the complete disassembly of the cable bus system.

Accordingly, in one aspect the present invention resides in a cable bus system comprising: a longitudinally extending raceway comprising, at least two levels of longitudinally extending cable trays, each cable tray including: a pair of generally parallel longitudinally extending side beams, and a plurality of laterally extending cross supports, the cross supports spanning between and being coupled to each said side beam and defining a cable support surface, said cross supports comprising a generally planar upper support surface selected to allow the electrical cables to be drawn thereacross without substantial damage to cable insulation, a bottom cover secured to a lowermost one of said cable trays, at least one electrical cable array disposed in an interior of said raceway and associated with a corresponding one of said cable trays, each said cable array comprising a plurality of insulated high amperature electrical cables disposed in a generally parallel spaced operable position in supporting contact against the upper support surfaces of the cross supports of the associated said cable tray, at least one clamping member for securing said cables substantially against movement from said operable position in said raceway, whilst allowing air flow longitudinally therebetween.

In another aspect the present invention resides in a high amperage electric cable bus system comprising: a longitudinally extending raceway comprising, a plurality of longitudinally extending cable trays, each cable tray having a generally modular construction and including an associated pair of generally parallel longitudinally extending side members, and a plurality of laterally extending cross supports, the cross supports spanning between and fixedly coupled to each said side member, and having a generally planar support surface, the cable trays being positioned in a generally stacked orientation with the side member of an a first said cable tray being secured in substantially aligned juxtaposition with the side members of a next lower cable tray, a plurality of electrical cable arrays selected for the distribution of high amperature polyphase electrical current disposed in an interior of said raceway, each cable array being associated with a respective one of said cable trays and comprising a plurality of generally parallel spaced electrical cables disposed in supporting contact with the support surfaces of the cross supports of the associated said cable tray, clamping members for securing said electrical cables of each cable array against movement relative to the cross supports of the associated cable tray, the clamping members being configured to permit longitudinal air flow along said raceway past said cross supports.

In a further aspect, the present invention resides in a longitudinally extending cable raceway section for use in a cable bus system, the raceway section including: a plurality of longitudinally extending cable trays, each cable tray including an associated opposing pair of longitudinally extending side members, and a plurality of laterally extending cross-brace members, the cross-brace members each defining a generally flat cable-support surface and spanning between and being fixedly coupled to each said side member, a bottom panel secured to a lowermost one of said cable trays and extending laterally substantially between each said side member to define a lower extent of the raceway section, a plurality of electrical cable arrays disposed in an interior of said raceway, each said cable array associated with a respective one of said cable trays and comprising a plurality of generally parallel spaced electrical cables mounted in supporting contact with support surface of the cross supports of the associated said cable tray, a plurality of clamping members for coupling said cables to the support surface of the cross supports and substantially against movement in said raceway while allowing longitudinal airflow along said raceway therepast.

BRIEF DESCRIPTION OF THE DRAWINGS

Reference may now be had to the following detailed description taken together with the accompany drawings, in which:

FIG. 20 illustrates a partial perspective view of a cable sleeve used in the vertical securement of electrical cables in a vertically oriented cable bus system in accordance with a preferred embodiment;

FIG. 21 is a perspective view of a vertically oriented cable bus system used in the vertical securement of electrical cables in the power destruction system shown in FIG. 19, with the top cover removed;

FIG. 23 illustrates a partial cross-sectional end view of the fastener and anchor bar shown in FIG. 22 in an assembled configuration.

DETAILED DESCRIPTION OF THE PREFERRED EMBODIMENTS

Figure 1:
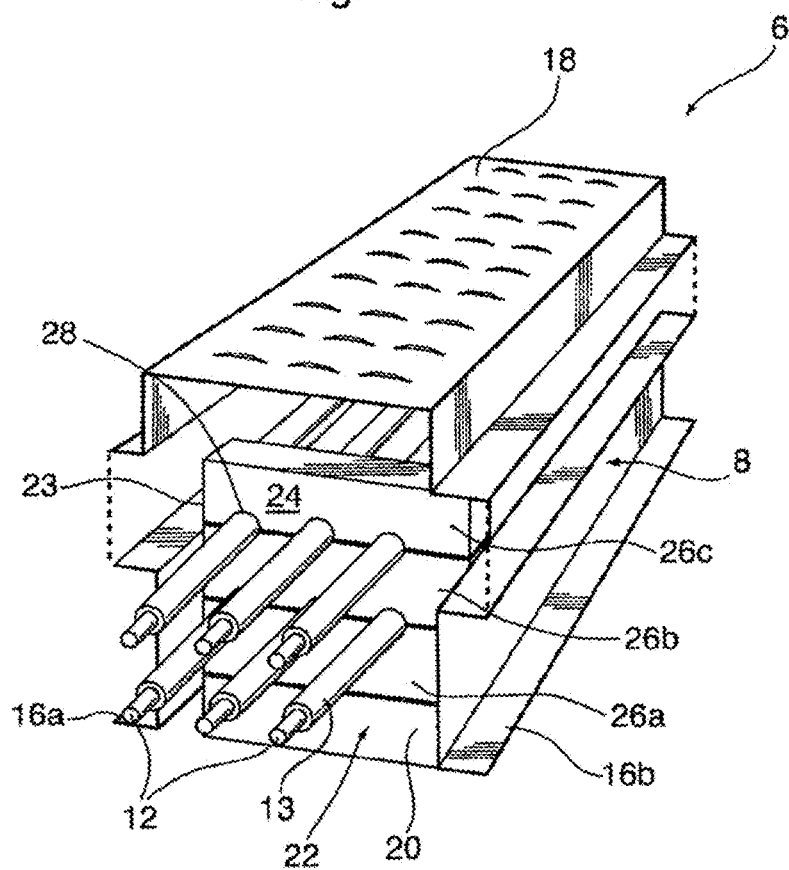
FIG. 1 shows a partial perspective exploded view of a prior art cable bus system used in the transmission of high amperature electrical current.
Figure 2:
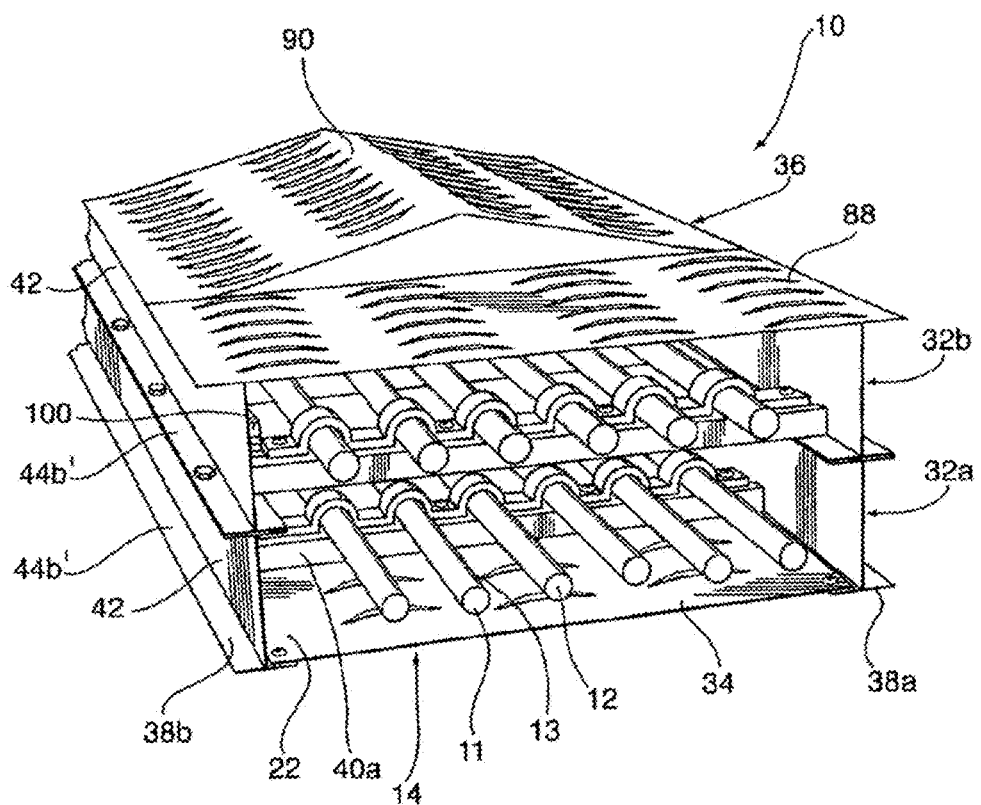
FIG. 2 shows a partial perspective view of multi-tray cable bus system in accordance with a preferred embodiment of the invention.
Figure 3:
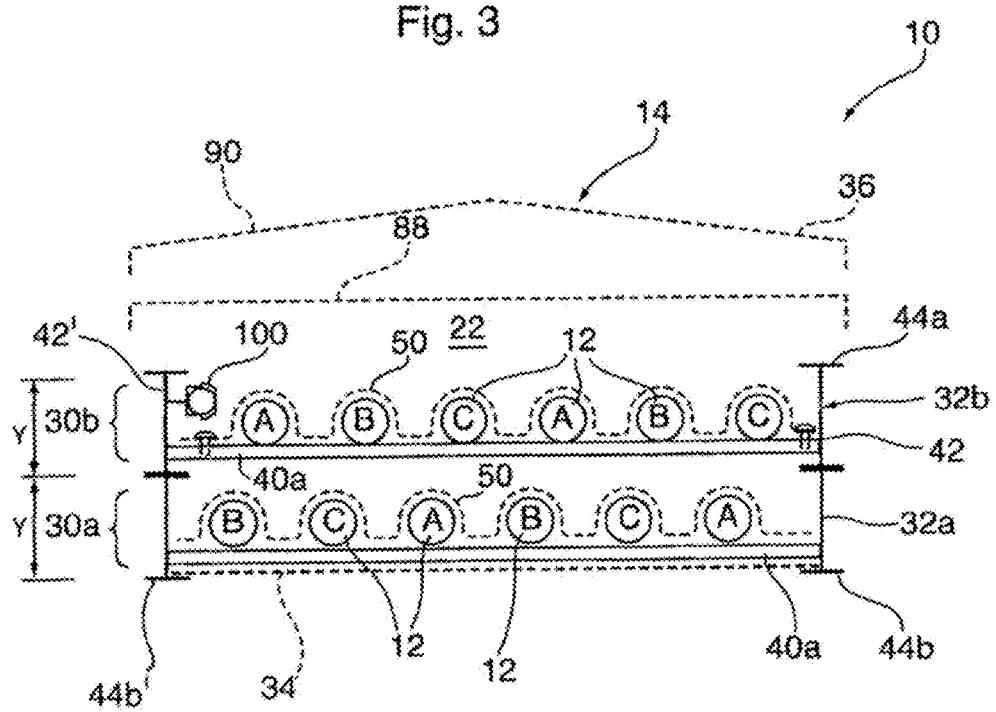
FIG. 3 shows a schematic sectional end view of the cable bus system shown in FIG. 2.

Reference is made to FIGS. 2 and 3 which illustrate a cable bus system 10 in accordance with a preferred embodiment of the invention used in the distribution and transmission of three-phase electrical power. As will be described, the cable bus system 10 is formed having one and preferably a number of aluminum (or other metal) enclosures 14 which define a longitudinally extending raceway 22 used to house and protect a series of insulated electrical cables 12.

FIG. 2 shows best each of the electrical cables 12 as comprising high amperature, low, medium and high voltage electrical cables which are provided in an electrically conductive core 11 layer which is typically formed of stranded copper wire, and an electrically insulating outer coating or sheath 13. In the embodiment shown, the cables 12 are longitudinally aligned in two vertically stacked, lower and upper cable arrays 30a,30b, each consisting of six cables 12 in parallel. As shown schematically in FIG. 3, the current of each phase A,B,C is divided equally between the paralleled electrical cables 12. The electrical cables 12 of each array 30a,30b are further staggered and offset laterally relative to each other to optimize inter-cable spacing to achieve balanced electromagnetic field selected to minimize mutual heating amongst the cables 12 and to maximize the transfer of heat away therefrom.

FIGS. 2 and 3 show best the metal enclosure 14 as including a pair of vertically stacked cable trays 32a32b, a ventilated bottom cover 34 and a ventilated top cover 36 which, in assembly, define the longitudinally extending raceway 22. Although not essential, most preferably at least one of the cable trays 30b is used to mount and is electrically connected to a grounding lead 100 serving as a ground path for stray voltage and/or in the event of electrical fault currents.

Each of the cable trays 32a,32b are normally formed from aluminum, or other suitable metal materials and are provided with a modular construction which allows for their use interchangeably. As shown best in FIGS. 3 and 4 the cable tray 32 includes a pair of longitudinally extending and parallel spaced sidewall members 38a,38b which are joined in a fixed, parallel spaced arrangement by a series of transversely extending cross-brace members 40a,40b,40c. The side members 38a,38b are shown as having a generally I-beam construction, with each including a longitudinally extending planar rectangular web 42,42', having generally transversely oriented planar flanges 44a,44a',44b,44b' joined along upper and lower edges thereof.

Figure 4:
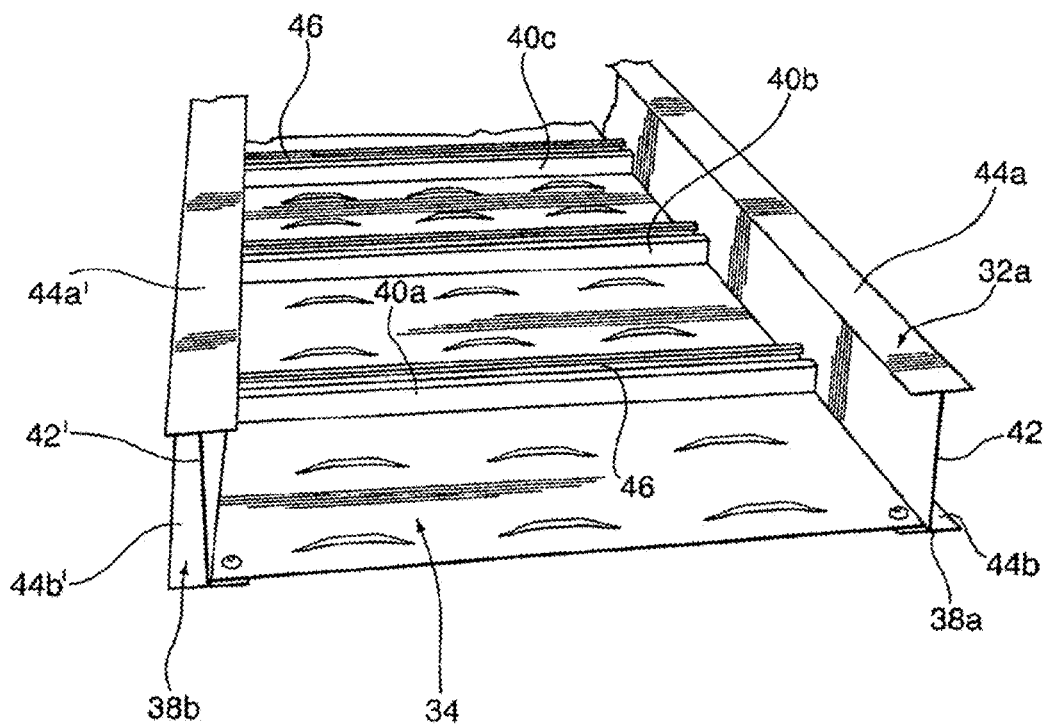
FIG. 4 shows a perspective view of a bottom most modular cable tray used in the cable bus system of FIG. 2 prior to the mounting of electrical cables therein.

As shown best in FIG. 4 the cross-brace members 40a, 40b,40c are welded to the web 42 of each side member 38a,38b, in position spaced a marginal distance above the lower flanges 44b. Although not essential, this configuration advantageously allows for the positioning of the ventilated bottom cover 34 in supported contact resting on top of the lower flanges 44b,44b' of the members 38a,38b. Preferably, the cross-brace members 40a,40b,40c are electrically conductive so as to carry any possible electrical fault current to instantly trigger circuit breaker activation. Although not essential, in the embodiment shown, the cross-brace members 40a,40b,40c are secured to the side members 38a,38b at staggered approximately one foot intervals with respect to a next tray 32b along the longitudinal length of the enclosure 14. The applicant has appreciated that the offset longitudinal spacing of the cross-brace members 40a,40b,40c relative to the enclosure ends allows the positioning of the next cable tray 32b in a stacked orientation thereon, and with the cross-brace members 40 of the next adjacent upper cable tray 32 being non-aligned from those of tray 32a. The non-alignment of the cross-brace members 40 of successively stacked cable trays 32 advantageously allows vertical axis to the cable arrays 30a,30b of both cable trays 32a,32b by simply removing the top cover 36, and without necessitating significant disassembling the enclosure 14.

In a simplified construction, the bottom cover 34 is normally formed as having a predetermined number of openings serving as vents to allow the heat produced by the cables 12 to flow out of the enclosure. The ventilated cover 34 has a lateral width which could be selected marginally less than the lateral distance separating the webs 42,42' of each side member 38a,38b. The bottom panel 34 may be screwed, bolted or riveted to the sidewall member flanges 44a,44b' in place, or in an alternate configuration secured in position by weldments.

The cross-brace members 40 function as a support base for the electric power cables 12 in the assembly of the cable bus system 10. The cross-brace members 40a,40b,40c are most preferably formed as upwardly open square C-shaped channels, with the top surface 46 of each cross-brace member 40 presenting a substantially smooth, burr-free horizontal surface. The applicant has appreciated that in ensuring the top surface 46 is provided without barbs, sharp projections, or other roughened features, allows the electrical cables 12 to be pulled longitudinally through the enclosure 14 while resting directly on the cross-brace members 40a, 40b,40c, without concern of damage to the cable insulating layer 13. In addition, the uninterrupted length of the raceway 22 advantageously provides enhanced longitudinal airflow along the raceway 22 itself, minimize the potential for local hot spots.

Figure 5:
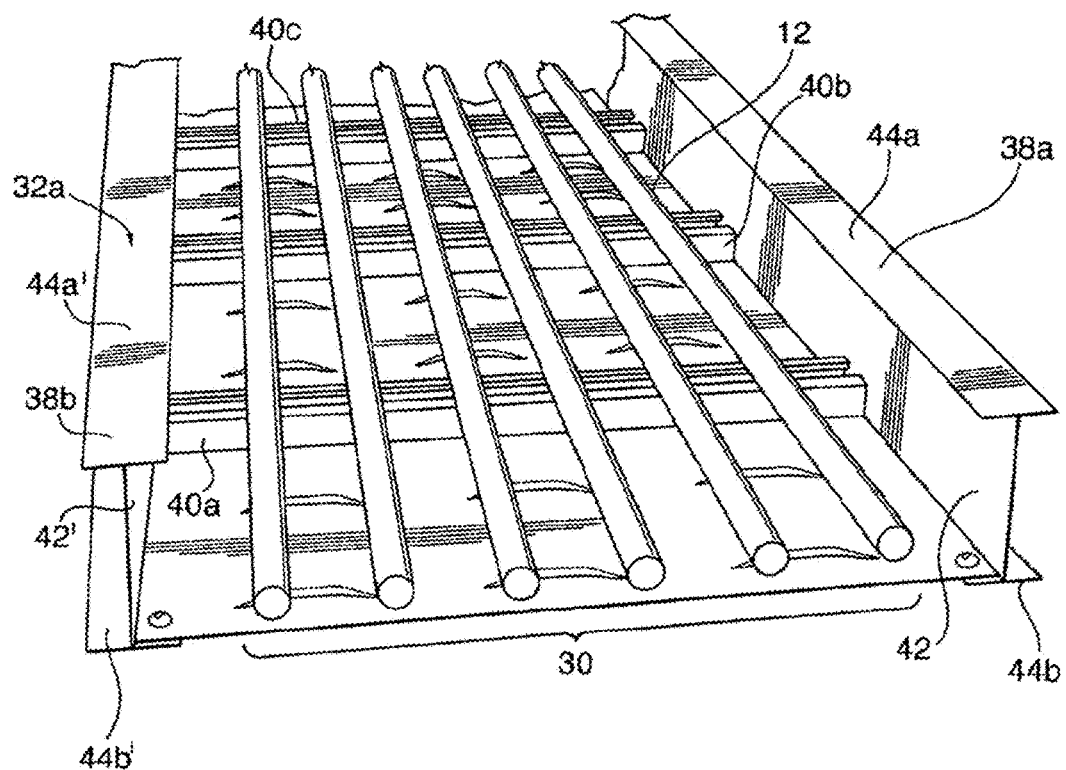
FIG. 5 shows a perspective view of the bottom tray of FIG. 4 illustrating the initial placement of a first cable array therein.

References made to FIG. 5 which illustrates the initial positioning of the first cable array 30a within the lower cable tray 32. In particular, following the securement of the ventilated bottom cover 34, the cables 12 of the cable array 30 are drawn along the raceway 22, along the longitudinal length of the enclosure 14. As each cable 12 is drawn, it moves over and is supported by the top surface 46 of the cross-brace members 40a,40b,40c. It is to be appreciated that because the raceway 22 is substantially unobstructed in its longitudinal direction, the cables 12 may be pulled directly across the cross-brace members 40a,40b,40c, without necessitating the use of cable rollers and other secondary support systems.

Figure 6:
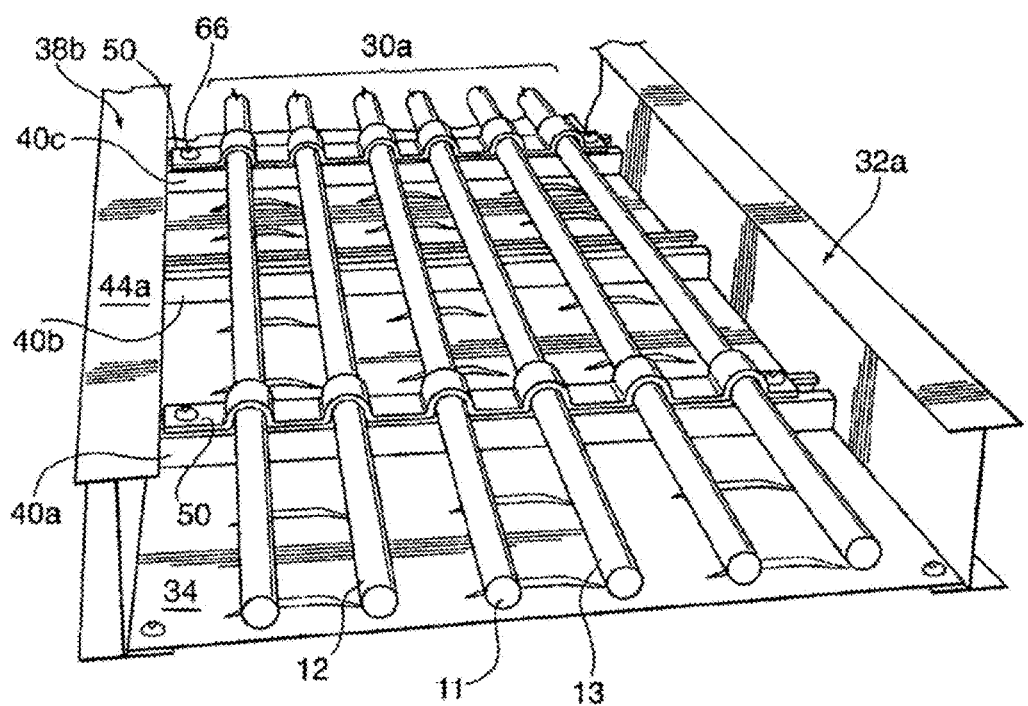
FIG. 6 illustrates a perspective view of the bottom tray of FIG. 4 showing the coupling of the first cable array in an operational position.
Figure 7:
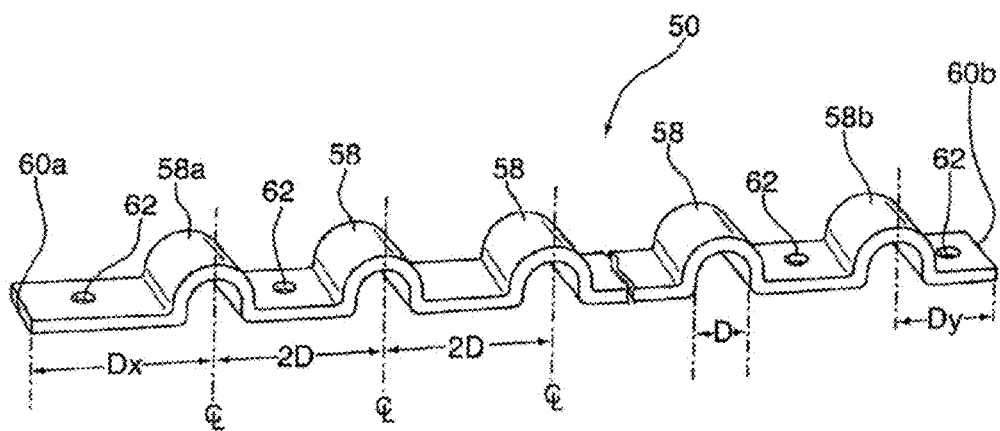
FIG. 7 illustrates a perspective view of the one piece contoured clamp used in securing electrical cables to the modular tray.

Following initial positioning of the first cable array 30a, the cables 12 are secured in place relative to the cable tray 32b by the use of series of one piece clamping bars 50. As shown in FIGS. 6 and 7, in a preferred construction, the clamping bars 50 are cut or stamped from an elongated bar of aluminum stock. Most preferably, the clamping bars 50 have an overall longitudinal length which is marginally less than the lateral spacing separating the side webs 42,42' of the cable tray sidewall members 38a,38b. Each clamping bar 50 is provided with six downwardly open U-shaped keeper pockets 58. The keeper pockets 58 have a lateral width which has a dimension D, and which corresponds generally to the diameter of the insulating sleeve 13 of each electrical cable 12. More preferably, the keeper pockets 58 are formed on respective centres which are separated by a distance 2D, selected at twice the insulating sleeve 13 diameter from the next adjacent pocket 58. It is to be appreciated that the lateral spacing of the keeper pockets 58 relative to each other advantageously ensures that the cables 12 in each cable array 30a,30b are maintained with an optimum spacing to balance electromagnetic fields, to minimize mutual heating amongst the cables 12 and to maximize the transfer of heat away from the cables 12 to the exterior of the cable bus system 10.

Although not essential, most preferably, the clamping bars 50 is asymmetrically formed. In this construction, the clamping bars 50 extend from a first end 60a to a second end 60b with a first keeper pocket 58a spaced by a distance $D_x$ from the end 60a, and the second other endmost keeper pocket 58b spaced from the second end 60b by a distance $D_y$. The applicant has appreciated that by selecting the distance $D_y$ at approximately half that of $D_x$, the clamping bars 50 may advantageously be used to orient the cables 12 of cable array 30a,30b in the desired laterally offset orientation relative to each other simply by reversing the orientation of the cable bars 50 when securing each successive cable array 30a,30b for each adjacent level in the raceway 22. By providing one end 60a of the clamping bar 50 with an extension longer that the other end 60b in an ideal triangular electrical place conductor configuration may be achieved by reversing the clamping bars 50 on each adjacent level. Cable electrical impedance may thus be reduced, lowering system power losses.

In this simplified construction, a series of boreholes 62 are formed adjacent each end of the clamping bars 50. The boreholes 62 are sized to receive therein screw fasteners 66 in the securement of each clamping bar 50 to selected cross-brace member 40a,40c with the cables 12 of the cable array 30a sandwiched in a friction fit therebetween. Most preferably, the screw fasteners comprise spring loaded bolts which engage hand tightenable wing wiring nuts to eliminate the need of a difficult to use power tools.

Figure 8:
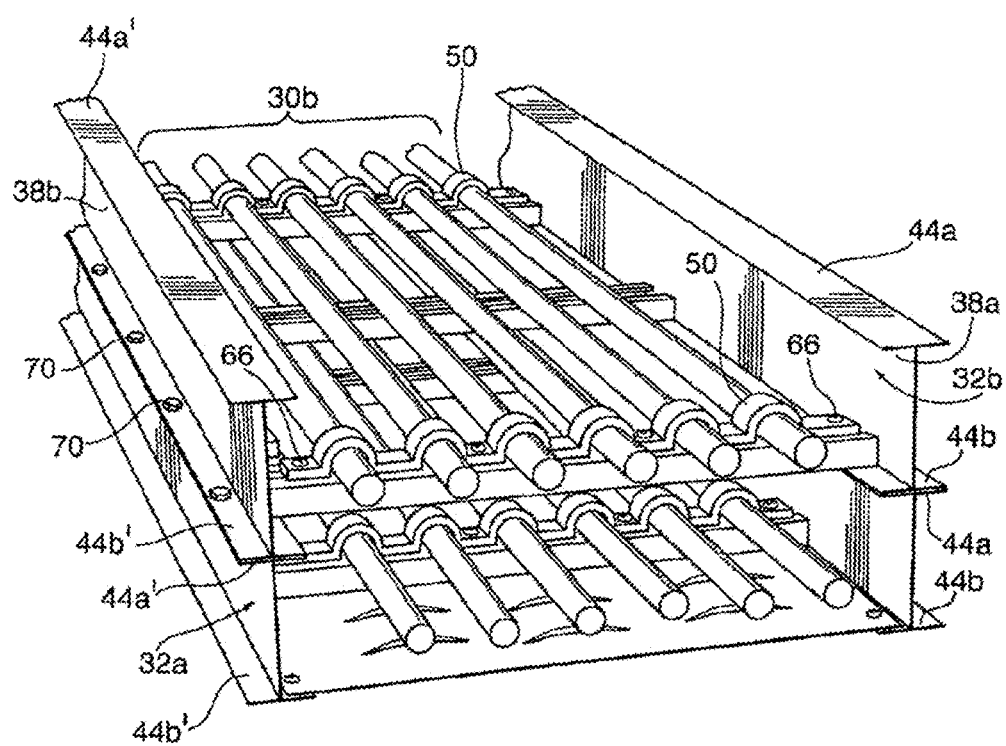
FIG. 8 illustrates the positioning of a second upper modular cable tray used in the positioning of a second cable array in the cable bus system of FIG. 2.

Preferably, following the securement of the cables 12 of the cable array 30a in the lower tray 32a, the upper cable tray 32b is positioned. The upper cable tray 32b is stacked on top of, and secured to the lower cable tray 32b to provide the enclosure with multiple levels (FIG. 8). In assembly, the cable tray 32a is oriented so that the lower flanges 44b,44b' of the side members 38a,38b are positioned aligned in juxtaposed contact with the upper flanges 44a of the side members 38a,38b of the lower cable tray 32a. More preferably, the cable tray 32b is oriented in position in a reverse longitudinal orientation relative to cable tray 32a so that the cross-brace members 40 of both cable trays 32a,32b do not vertically aligned. The cable trays 32a,32b are coupled to each other by the insertion of bolts 70 or other mechanical fasteners through the juxtaposed flanges 44a,44b and 44a', 44b'.

Following the securement or the cable tray 32b, the electrical cables 12 of the upper cable array 30b are then drawn through the raceway 22 positioned and clamped to the cross-brace members 40a,40c of the upper cable tray 32b, by the use of clamping bars 50 which are oriented in the reverse and staggered manner from those used to secure the lower cable array 30a.

In the present invention, the length of the clamping bars 50 is further selected to advantageously act as a spacer to maintain the cables 12 a preferred spacing from the sidewalls webs 42,42' and from each other.

In the preferred construction shown, the top cover 36 is secured to the top flanges 44a,44a' of the topmost cable tray 32b by way of screws or other fasteners allowing for future easy removal.

FIGS. 2 and 3 show the top cover 36 as including both a flat and peaked ventilated cover panels 88,90. It is to be appreciated that the peaked cover panel 90 advantageously may be used to provide for the enhanced shedding of snow, water and other debris which may accumulate on the upper surface of the metal enclosure 14. Although not essential, the flat cover panel 88 may be provided in areas where debris or fallen material will not accumulate to restrict the ventilation.

Following the securement of the upper cable array 30b, the cover panels 88,90 are screwed or bolted to the upper flanges 44a,44a' of the upper cable tray 32b to complete the metal enclosure 14.

Although the detailed description describes the use of a clamping bar 50 to secure electrical cables 12 against movement, the invention is not so limited. It is to be appreciated that other clamping arrangements including, without restriction, the use of individual cable clamps may also be used, and will now become apparent.

It is to be appreciated that with the modular construction of the cable trays 32a,32b, if power delivery requirements increase in future, the cable bus system 10 may be easily expanded. For example, to increase electrical transmission capacity, the top cover 36 is removed, and a third level or more cable trays 32 used to secure additional cable arrays may easily be secured over the upper cable tray 32b in the same manner as its attachment to cable tray 32a. Following installation of the desired number of additional cable trays, the top cover 36 is reinstalled.

In addition, the present invention advantageously allows for the simplified servicing and replacement of one or more electrical cables 12. In the event cable replacement is required, the top cover 36 is removed. Because the cross-brace members 44a,44b,44c of the lower cable tray 32a are non-aligned with those of the upper cable tray 32a, it is possible to directly access and remove the clamping bars 50 used to secure the lower cable array 30a in place without requiring disassembly and/or removal of the cable array 30b.

Figure 9:
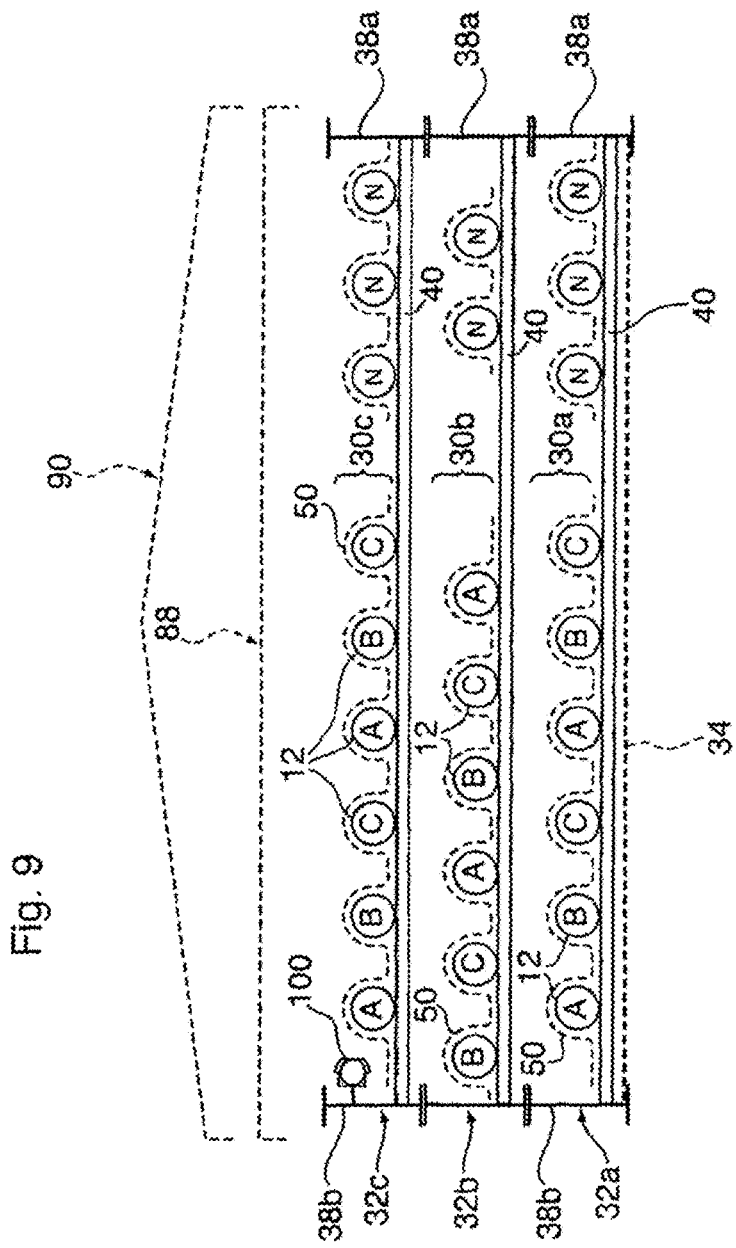
FIG. 9 shows a schematic sectional end view of a cable bus system in accordance with a further embodiment of the invention which shows the positioning of further neutral wires identified as N.

Although the detailed description describes the cable bus system 10 as including a pair of cable arrays 30a,30b, which each include six electrical cables 12, the invention is not so limited. It is to be appreciated that the present invention is equally suited for use in the mounting of fewer or greater numbers of cable arrays 30, having fewer or greater numbers of individual electrical cables 12. Reference may now be had to FIG. 9, which shows an electrical cable bus system 10 in accordance with an alternate embodiment of the invention, and in which like reference numerals are used to identify like components. In FIG. 9, the cable enclosure 14 is provided as housing three electrical cable arrays 32a,32b,32c, of cables 12, and which are mounted respectively in cable trays 30a,30b,30c.

In FIG. 9, the cable trays 30a,30b,30c are each configured to support and mount a cable array which includes up to 18 high amperature, high voltage electrical cables 12. The electrical cables are secured in place by clamping bars 50 which have a number of keeper pockets 58 modified accordingly to the number of cables 12 to be secured.

Optionally the enclosure 14 may be provided with a number of electrical receptors, neutral conductors (N) or null spacing or voids which, for example, allow the future expansion of the cable bus system 10 to include additional power cables, in each array 30a,30b,30c should electric transmission or distribution demands increase. It is to be appreciated that in assembly neutral conductors (N) will vary, depending on type of electrical system that is being corrected.

While the detailed description describes and illustrates the cable tray 32b as being positioned vertically on top of the cable tray 32a, the invention is not so limited. It is to be appreciated that although illustrated in a horizontal orientation, the metal enclosure 14 could also be mounted vertically and/or in an inclined position depending on the site of installation and the intended direction of the electrical raceway 22.

Figure 10:
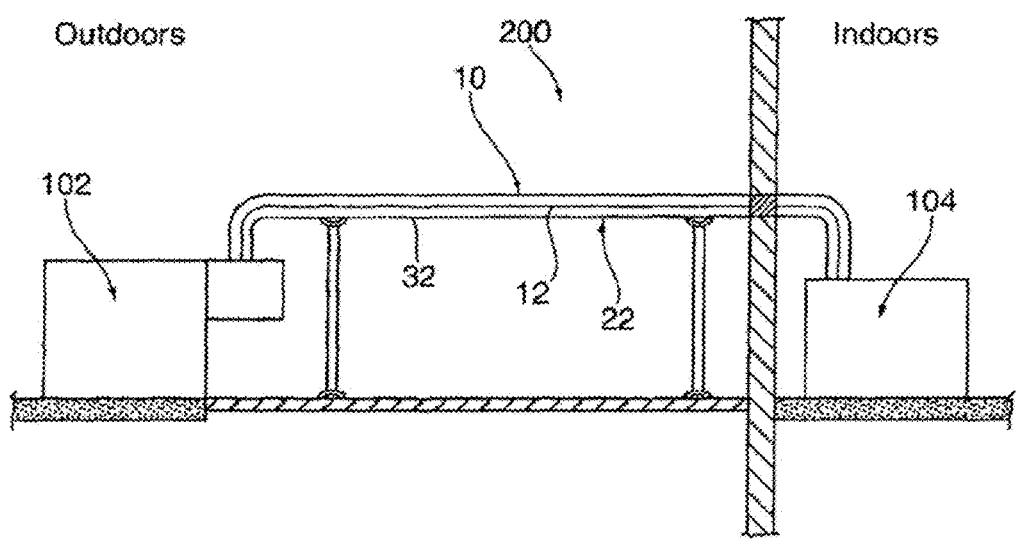
FIG. 10 shows a schematic side view of an above-ground power distribution system which incorporates a cable bus system in accordance with a preferred embodiment of the invention.
Figure 11:
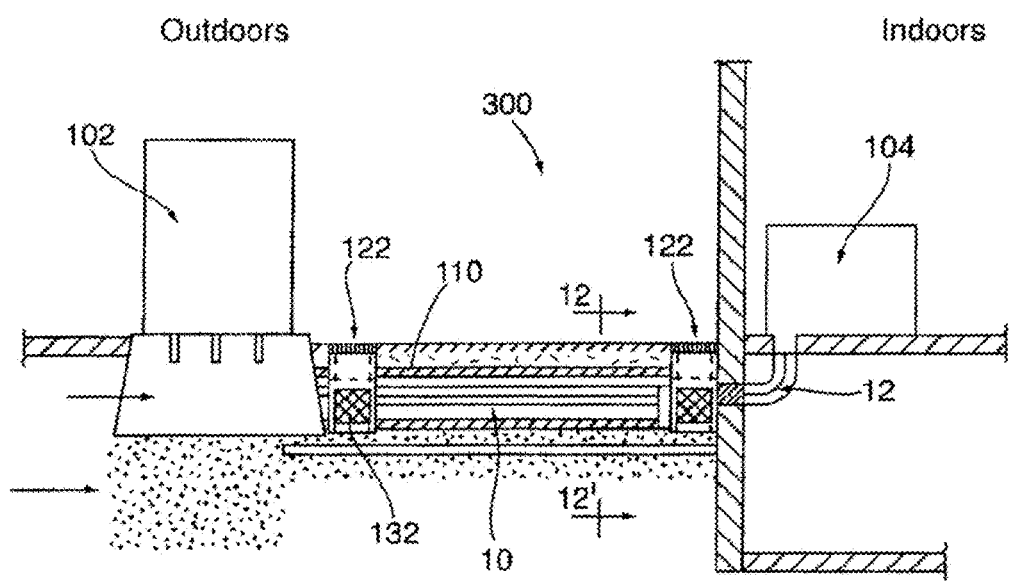
FIG. 11 shows a schematic side view of a cable bus system installed as a part of a subterranean power distribution system in accordance with another embodiment of the invention.
Figure 15:
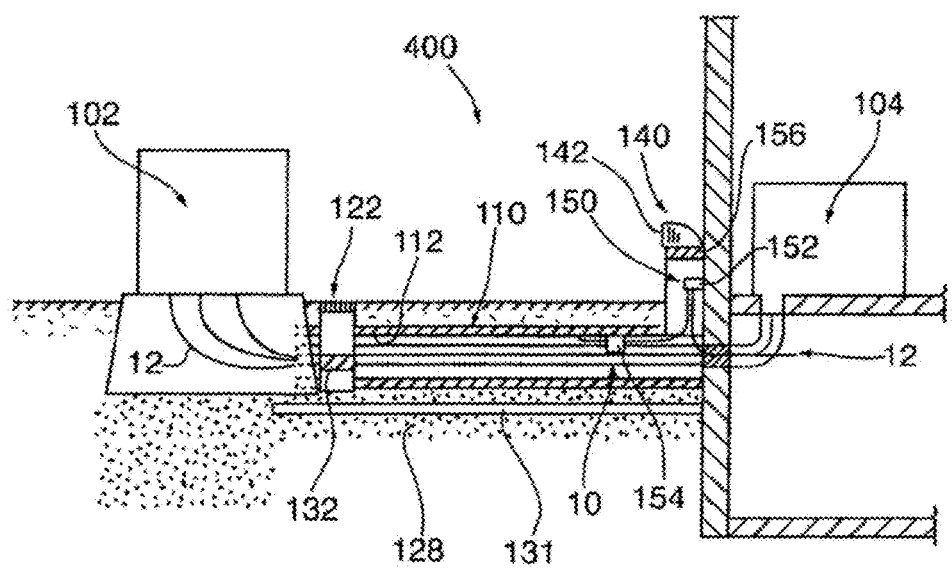
FIG. 15 shows a schematic side view of cable bus systems installed as a part of a subterranean power distribution system in accordance with another embodiment of the invention.

Reference is now made to FIGS. 10, 11 and 15 which show assembled power distribution systems 200,300,400 which incorporate a cable bus system 10 in accordance with the present invention, and in which like reference numerals are used to identify like components.

FIG. 10 shows an above-ground power distribution system 200 in which a cable bus system 10 is provided for the power between a power sending end 102 and a power receiving end 104. As the cable bus system 10 is positioned within the open air, any heat generated within the cables 12 flows both perpendicularly as well as longitudinally along the raceway 22 throughout the circuit length, ensuring against potential hot spots.

Figure 14:
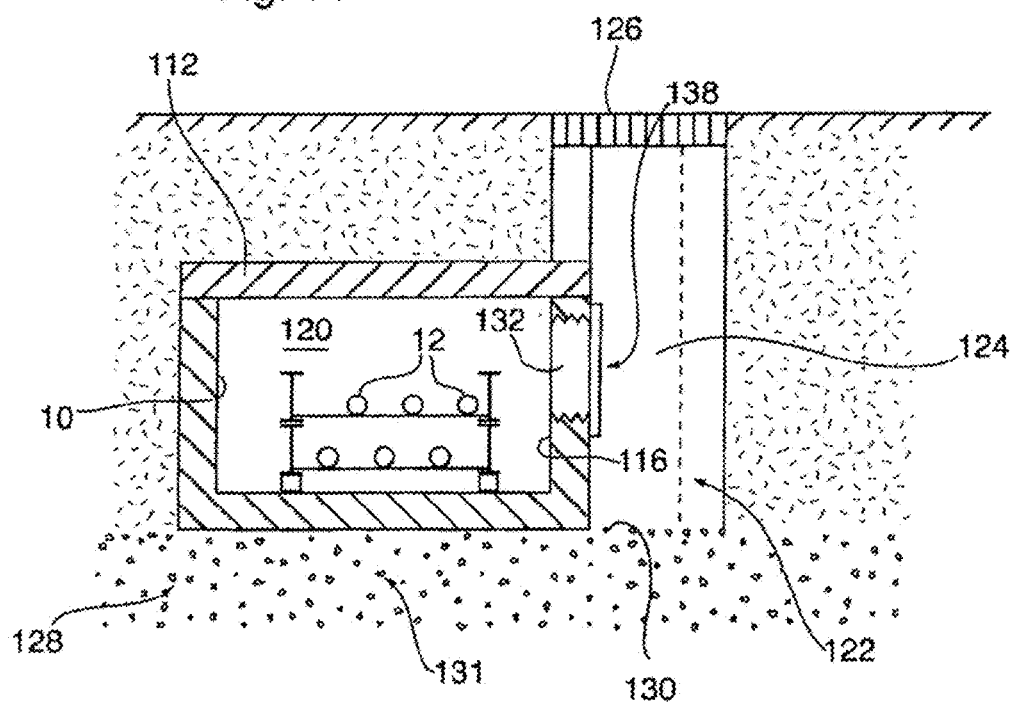
FIG. 14 shows a cross sectional view of the air vent shown in FIG. 11, taken along 14-14'.

FIGS. 11 and 14 show respectively alternate power distribution systems 300,400 which are adapted for below ground installation in transmitting and conducting electricity from power sending end 102 to the power receiving end 104.

Figure 12:
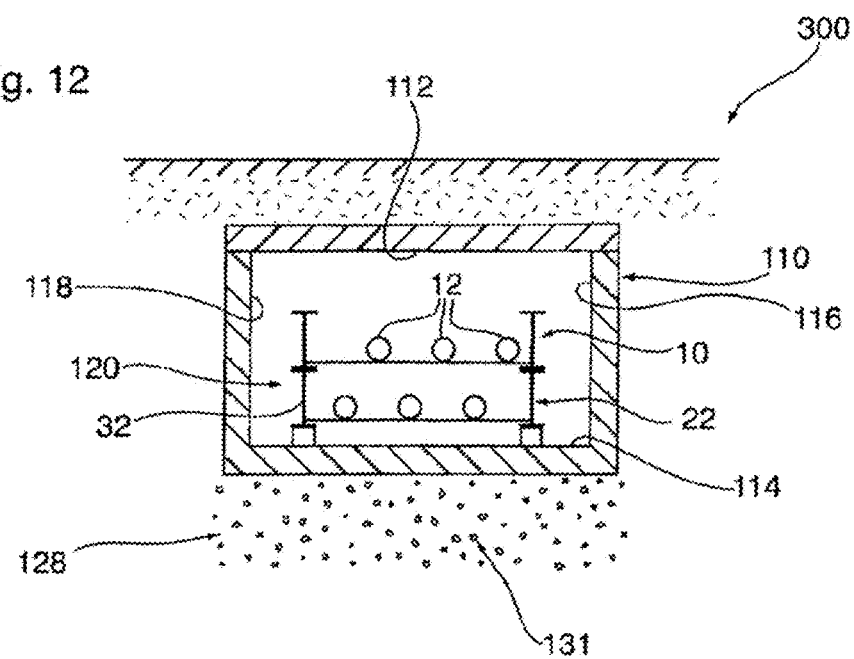
FIG. 12 shows a cross sectional view of the subterranean power distribution system shown in FIG. 11, taken along 12-12'.
Figure 13:
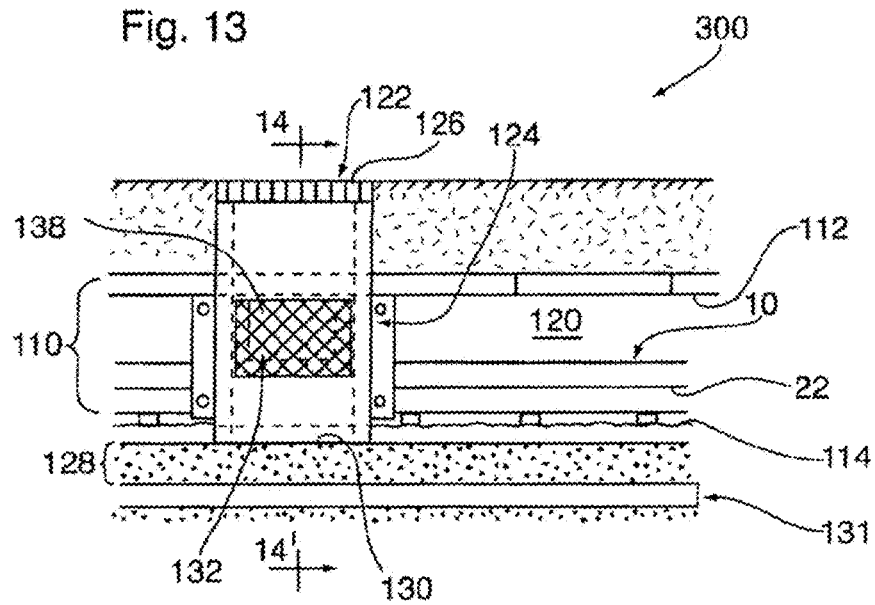
FIG. 13 shows an enlarged side view of vertical air vent used in the subterranean power distribution system of FIG. 11.

As shown best in FIGS. 11 to 13, the subterranean power distribution system 200 is formed having a concrete vault or enclosure 110 which is sized to house the cable bus system 10 therein. Most preferably, the enclosure 110 has a generally rectangular cross sectional profile housing with a closed top, bottom and sidewall 112,114,116,118. The enclosure 110 most preferably has a maximum width of less than about 1 meter and a height of less than about 1 meter. The enclosure 110 defines an internal cavity 120, which extends longitudinally from the sending end 102 to the power receiving end 104 with the cable bus system 10 extending lengthwise therein. As shown best in FIG. 12, the top of the enclosure 110 is sealed. To provide a more economical construction, the cable bus system 10 may be provided without the top cover 36 for increased air circulation.

As shown in FIGS. 13 and 14, where longer enclosures 110 are necessary, the power distribution system 300 may be provided with one or more vertical air vents 122. The air vents 122 include an air vent shaft 124 which extends vertically downwardly from a surface grate 126. The bottom 130 of the shaft 124 is preferably open and lined with gravel 128 allowing for the drainage of any water which accumulates therein outwardly by way of underlying drainage tile 131. Most preferably, the sidewall aperture 132 is spaced vertically above the bottom 130 of the air vent shaft 124. As shown best in the cross-sectional view of FIG. 13, each vertical air vent 122 allows for airflow and communication from the interior 120 of the enclosure 110 by way of a sidewall aperture 132 formed through the sidewall 116, and which opens into the vent shaft 124. Most preferably the air vent grate is positioned a vertically spaced distance above the bottom 130 of the air vent shaft 124 by a distance selected to prevent any water, leaves or any other debris which may accumulate within the shaft 124 from blocking the aperture 132 and/or flowing into the enclosure interior 120. Although not essential, preferably the air vent shaft 124 and aperture 132 are each provided with mesh screening 126,138 to for safety and to prevent ingress by rodents and other pests.

It is be to appreciate that the subterranean power distribution system 300 shown in FIG. 11 advantageously allows for maximum enhanced free air flow along the length of the enclosure 110 and about the cable bus system 10, to allow for the electrical transmission of maximum cable amperage. In particular, in the construction shown, air may freely flow both vertically through the air vents 122, as well as longitudinally along the enclosure 110 to exhaust any cable generated heat.

Although FIG. 11 illustrates the power distribution system 300 as including two vertical air vents 122, it is to be appreciated that the number of vents 122 will change depending on air flow requirements.

Reference may be had to FIG. 15 which shows schematically a subterranean power distribution system 400 in accordance with a further embodiment of the invention, and in which like reference numerals are used to identify like components. In FIG. 15, increased airflow into the concrete enclosure 110 is provided by way of a periscope-type air vent 140 which cooperate with in-ground offset vertical air vents 122 to provide enhanced longitudinal air flow. In particular, the airflow vent 140 extends upwardly through the top wall 112 of the enclosure to a raised vent outlet 142. The height of the vent outlet 142 is positioned to avoid possible obstruction by snow or other debris. As shown best in FIG. 15, a power fan vent unit 150 is provided to assist exhausting any warm air from within the enclosure interior 120. The power fan vent unit 150 includes a thermostat control 152 temperature sensor 154 and power fan 156. The thermostat control 152 is operable to preselect a desired ambient temperature surrounding the cables 12. The temperature 154 attached to the thermostat 152 is positioned at a selected high temperature location along the length of the underground enclosure 110. When temperature within the enclosure interior 120 exceeds the a preselected threshold, the power fan 156 is activated to blow cool air downwardly into the enclosure 110, forcing any warmer air therein to be exhausted through the offset vertical air vents 122.

Although FIG. 15 illustrates a most preferred embodiment of the invention in which a power fan vent unit 150 is provided for cooling the cable bus system 10, the invention is not so limited. It is to be appreciated that in an alternate possible construction, the power fan unit could be provided in conjunction with or as part of an air conditioning unit to further facilitate cable cooling, where for example, still increased high amperages per cable are desired. In particular, for every 10° C. of enclosure cooling, cable amperage may be increased by approximately 10%. It is to be appreciated that if increased amperature for the system is required, particularly on an intermittent basis, it may be substantially less costly to increase the amperature to existing cables 12 by air conditioning, rather than retrofitting or replacing the entire cable bus system 10. In embodiments where an air conditioning unit is provided in place of the power fan vent unit 150, any offset vertical vents 122 could be omitted, and a suitable air conditioner, cooling coil and fan would be provided.

Figure 16:
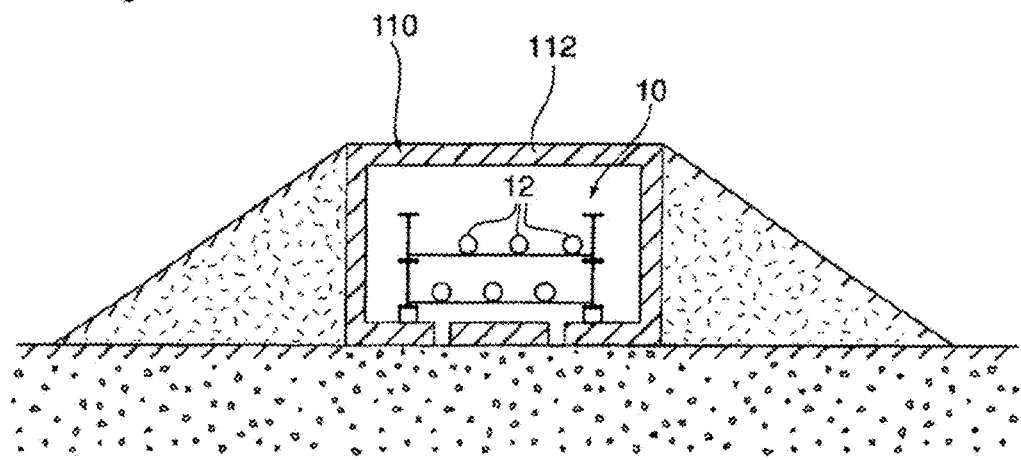
FIG. 16 shows a cross-sectional view of a power distribution system which incorporates a cable bus system in accordance with a preferred embodiment, installed above grade.
Figure 17:
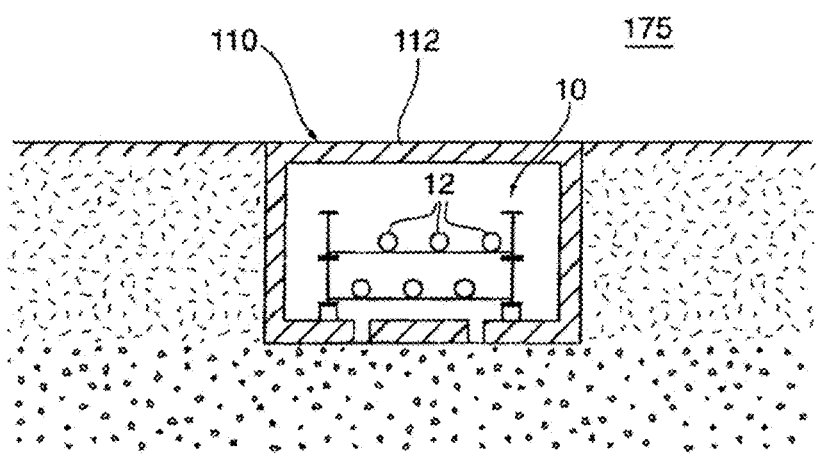
FIG. 17 shows a power distribution system which incorporates a cable bus system in accordance with a preferred embodiment, installed directly on grade in accordance with an alternate embodiment.

It is to be appreciated that the cable bus system 10 of the present invention advantageously is adapted for installation in both above and underground applications. By way of non-limiting example, as shown in FIG. 16, where underground rock formations 175 are encountered which prohibit the economic installation of the cable bus system 10 below grade, the cable bus system 10 may be gradually diverted upwardly aboveground and over any obstacles and top covered with a suitable berm. If necessary, the cable bus system 10 may then be returned back below ground, either directly on grade as shown in FIG. 17 with or without a covering enclosure 110, or re-buried by covering with a suitable fill, or the like as shown in FIG. 12.

Although the detailed description describes the clamping bar 50 and the enclosure 14 is made of aluminum, the invention is not so limited. Both the clamping bar 50 and/or enclosure 14 could be made of a variety of materials including other types of metals, cellulose based materials, wood, as well as plastics and polycarbonate-based compounds.

Figure 18:
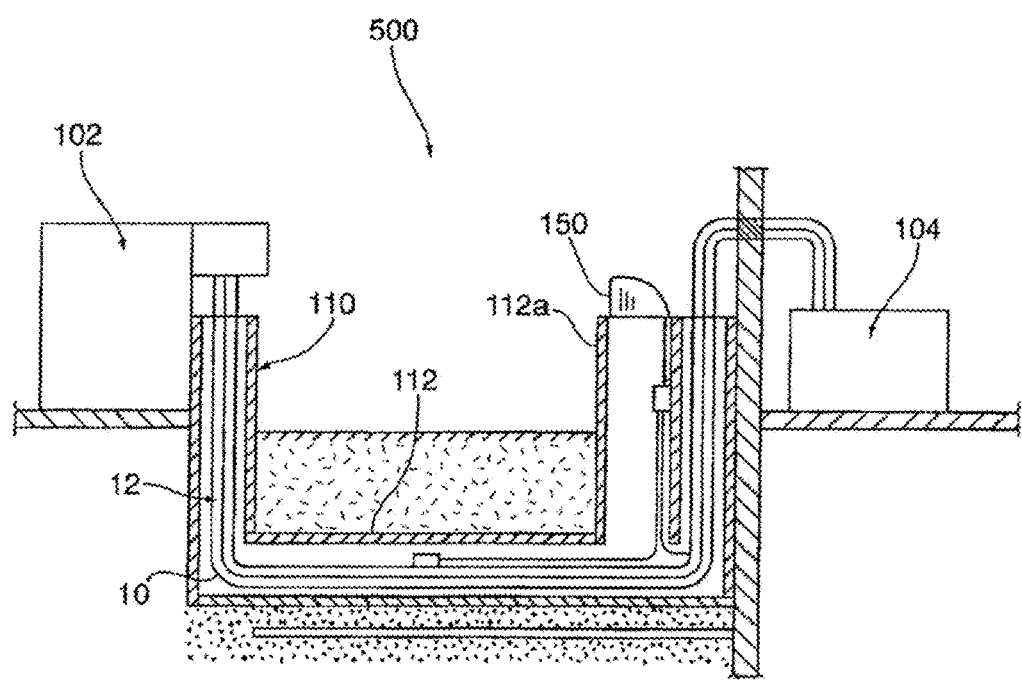
FIG. 18 illustrates a schematic side view of a cable system installed as part of a subterranean power distribution system in accordance with a further possible construction.

Reference may be had to FIG. 18 which shows schematically a subterranean distribution system 500 in accordance with a further embodiment of the invention and in which like reference numerals are used to identify like components.

In FIG. 18, the top wall 112 of the enclosure 110 is provided with an outwardly open U-shaped profile along its vertical extent. In the preferred construction shown the sides of the U-shaped cover portion 112a act as a bollard which provide additional structural protection for the power fan vent unit 150. The power distribution system 500 shown in FIG. 18 is envisioned for the transmission for electrical power from a power sending end 102 such as a transformer to the power receiving end 104.

Figure 19:
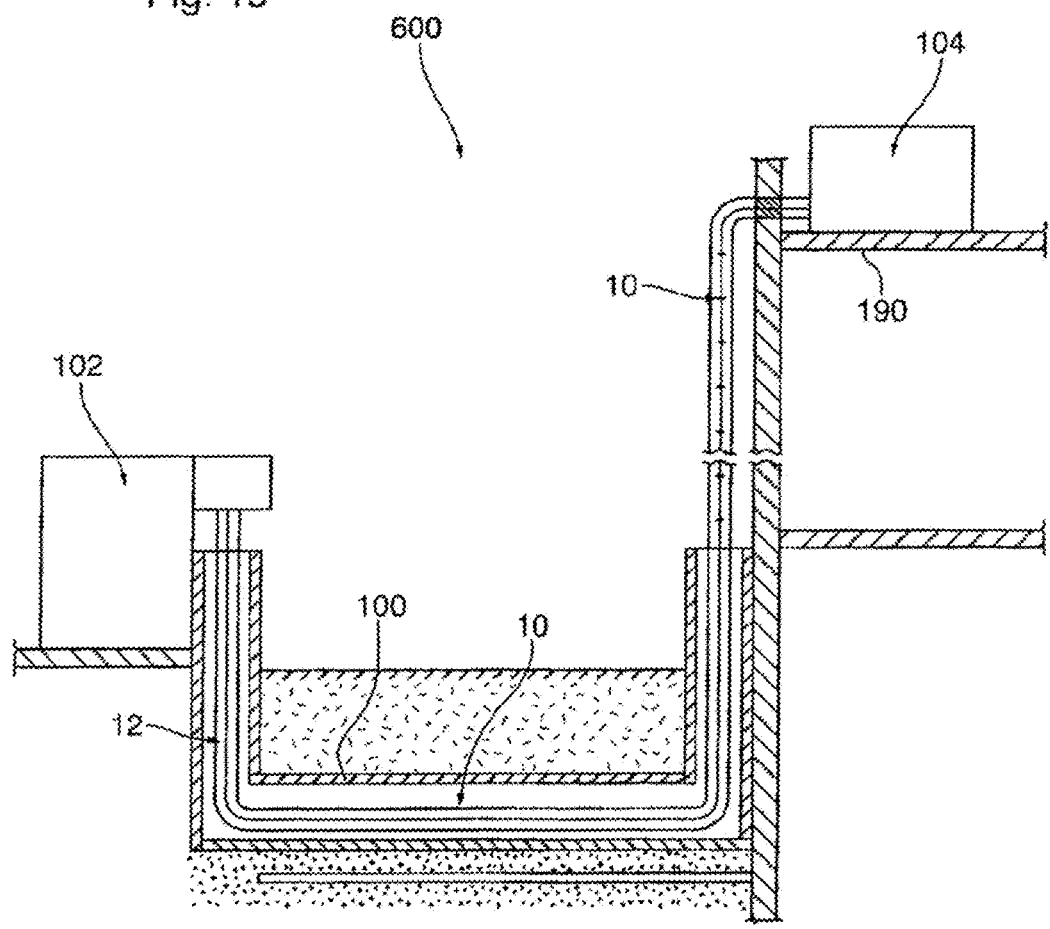
FIG. 19 shows a schematic side view of a cable bus system installed as part of a power distribution system for high rise applications.

Reference may be had to FIG. 19 which illustrates a power distribution system 600 used to transmit power from a power sending end such as a transformer 102 to a vertically displaced power receiving end 104, as for example, is found in high-rise applications. In FIG. 19, like reference numerals are used to identify like components.

In addition to the subterranean vault or enclosure 100, the cable bus system 10 extends vertically above grade to the height of a desired target building floor 190. As shown best in FIGS. 20 and 21, where the cable bus system 10 extends vertically, a serious of anti-slip sleeves or grommets 210 are provided to assist in the vertical securement of the electrical cables 12. In particular, the grommets are formed from an elastomeric material such as suitable plastic, rubber or Neoprene™ and are characterized by a split cylindrical side wall 212 which extends axially and which integrally formed at an end thereof, a pair of radially projecting tabs 214a, 214b.

As shown best in FIG. 20, the sleeve 210 has a radial diameter $R_d$ which is selected marginally less than the cables 12. The sleeves 210 may advantageously be positioned about the cables 12 at the point of their attachment to the cross-brace members 40, so that the tabs 214a,214b are bearing contact with the upward-most surfaces of cross-brace members 40 and clamping bars 50. It is to be appreciated that the securement of the sleeves 210 interposed between the clamping bar 50 and cross-brace 40 provides increased frictional as well as mechanical clamping force to the cables 12, minimizing the likelihood that the cables 12 may sag vertically under their weight.

Figure 22:
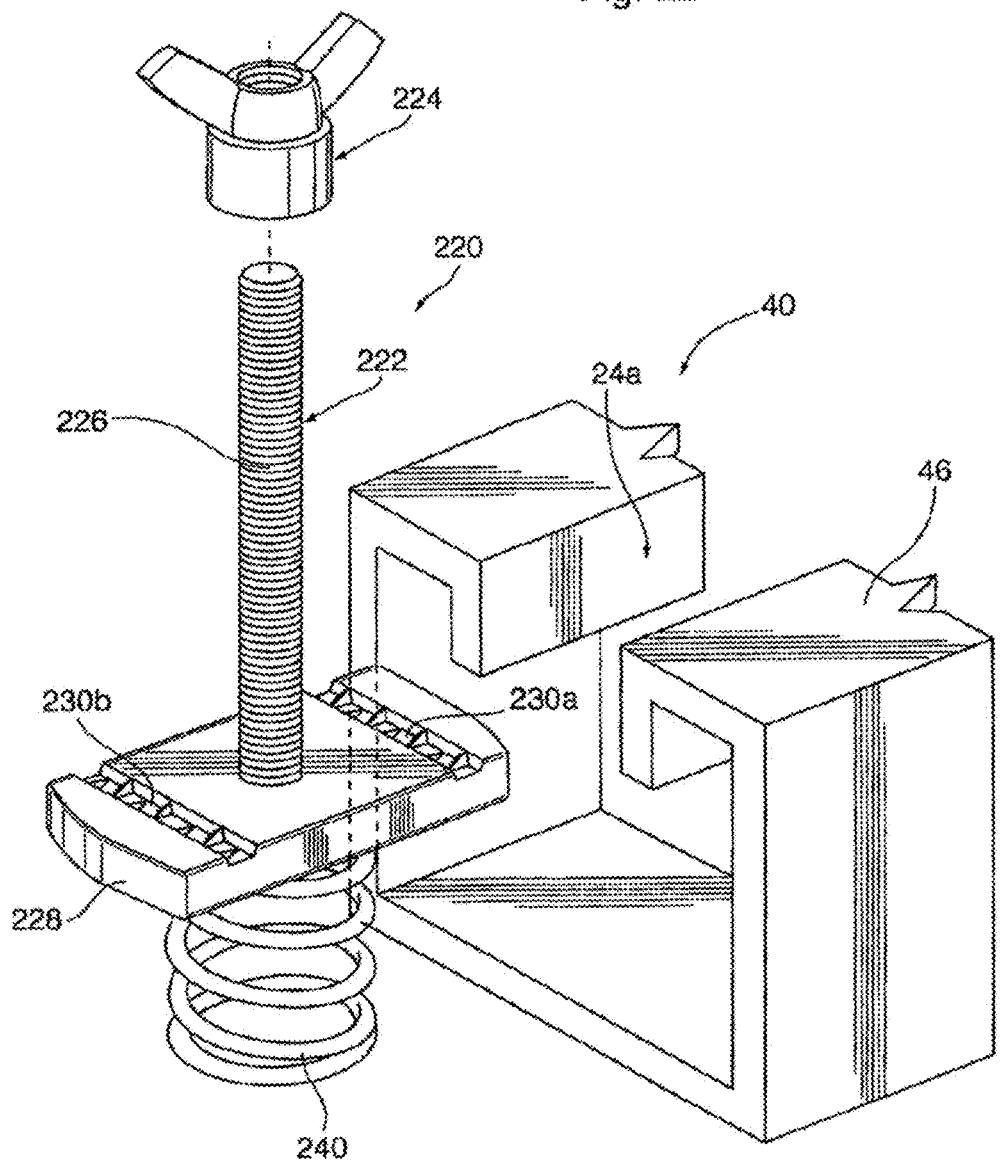
FIG. 22 illustrates an exploded perspective view of a fastener and anchor bar construction used in securing electrical cables within the cable bus system in accordance with a further embodiment of the invention.

Reference may be had to FIGS. 22 and 23 which illustrates a most preferred fastener bolt assembly 220 used in the securement of the clamping bars 50 to each cross-brace member 40. The bolt assembly 220 includes a spring biased anchor bolt 222, and a wing nut 224. The anchor bolt 222 includes a threaded shaft 226, seating plate 228 and a compressible helical spring 240.

It is to be appreciated that the shaft 226 is configured for threaded engagement by the wing nut 224.

As shown in the exploded view, the seating plate 228 preferably includes a pair of locating guide grooves 230a, 230b which are spaced for engagement with the sides of the cross-brace member 40 which define the open channel 24a therein. The plate 228 is provided with a dimension selected to allow its insertion into the channel 24a in a first orientation, while preventing its removal therefrom when rotated to align the grooves 230a,230b transversely relative thereto. The spring 240 has a length selected to resiliently bias the seating plate 228 into engaging contact with the underside of the channel top surface 46 to assist in maintaining desired positioning as the wing nut 224 is tightened along the shaft 226.

While the preferred embodiments disclose the use of the cable bus system 10 as used in the transmission and distribution of three-phase high amperature electric power, it is to be appreciated that the invention is equally suited for other polyphase or mono-phase power distribution and/or transmission, depending on load and power generation requirements.

Although the detailed description describes and illustrates various preferred aspects, the invention is not so limited. Many modifications and variations will now occur to persons skilled in the art. For definition of the invention, reference may be had to the appended claims.

I claim:

1. A subterranean power distribution system, including:
   a cable bus system comprising:
   a longitudinally extending raceway comprising:
   at least two levels of longitudinally extending cable trays, each cable tray including:
   a pair of generally parallel longitudinally extending side beams, and
   a plurality of laterally extending cross supports, the cross supports spanning between each said side beam and defining a cable support surface,
   at least one electrical cable array disposed in an interior of said raceway and associated with a corresponding one of said cable trays, each said cable array comprising a plurality of insulated high amperature electrical cables disposed in a generally longitudinally parallel spaced operable position in supporting contact against the upper support surfaces of the cross supports of the associated said cable tray, at least one clamping member for securing associated said cables to an associated cross support substantially against movement from said operable position in said raceway; and a below ground cable bus enclosure, the cable bus enclosure having a top, a bottom and opposing sidewalls defining a longitudinally extending enclosure cavity sized to receive the raceway therein whilst allowing substantially free air flow longitudinally relative to said raceway, a ventilation assembly for facilitating air flow into or from said enclosure cavity, said ventilation assembly including, an air vent shaft extending generally vertically from a lower end to an upper end portion, the air vent shaft further comprising at least one opening fluidically communicating with said enclosure cavity and permitting air flow from said enclosure cavity into said air vent shaft, the raceway being at least partially supported by the enclosure bottom and disposed at least partially within and extending along a length of said enclosure cavity.

2. The power distribution system of claim 1, wherein the cable bus enclosure comprises a subterranean concrete vault, wherein the top of the vault is substantially sealed.

3. The power distribution system of claim 2, wherein the upper end portion of the air vent shaft is in fluid communication with the atmosphere.

4. The power distribution system of claim 3, wherein said opening is spaced vertically a distance above the lower end of the shaft.

5. The power distribution system of claim 1, wherein the air vent shaft extends vertically upwardly to a surface grate, and wherein the lower end of the air vent shaft is open to allow drainage of water therefrom.

6. The power distribution system of claim 1 further including a power fan assembly which is activatable to blow air into or from the enclosure cavity when a temperature of the enclosure cavity exceeds a predetermined threshold temperature.

7. The power distribution system of claim 1, wherein each said clamping member is configured to secure said associated cable to the associated cross supports, whilst allowing airflow longitudinally therepast along said raceway.

8. The power distribution system of claim 2, wherein the cable bus enclosure has a maximum lateral width selected at less than about 1 meter and a height selected at less than about 1 meter.

9. The power distribution system of claim 1, wherein said at least one opening comprises an offset side aperture formed in one of said sidewalls and spaced vertically a distance above the lower end of the shaft, and the air vent shaft extends vertically upwardly to a surface grate or a periscope-type air vent.

10. The power distribution system of claim 9, wherein the ventilation assembly comprises a plurality of said air vent shafts at locations longitudinally spaced from each other along said enclosure cavity.

11. The power distribution system as claimed in claim 10, wherein a first said air vent shaft includes a vent opening fluidically communicating said enclosure cavity with an outside air source, a fan unit operable to induce air flow from said air source into the enclosure cavity via the vent opening, and a thermostatic control operable to activate said fan unit when a temperature in the enclosure cavity exceeds a predetermined threshold temperature.

12. The power distribution as claimed in claim 11, wherein the outside air source is selected from the group consisting of an air conditioned air source and atmosphere.

13. A high amperage power distribution system comprising:

a below-ground cable enclosure having a top, a bottom and sidewalls defining a longitudinally extending enclosure cavity, and a longitudinally extending cable raceway section disposed in said enclosure cavity, the raceway section, including:

a plurality of longitudinally extending cable trays, each cable tray including an associated pair of generally parallel longitudinally extending side members, a plurality of laterally extending cross supports spanning between and coupled relative to each said side member and defining a cable support surface, the cable trays being positioned in a generally stacked orientation with the side members of a first said cable tray being secured in substantially aligned juxtaposition with the side members of a next lower cable tray, a plurality of electrical cable arrays selected for the distribution of high amperature polyphase electrical current disposed in an interior of said raceway, each cable array being associated with a respective one of said cable trays and comprising a plurality of generally parallel spaced electrical cables selected to conduct high amperature, polyphase electrical current disposed in supporting contact with the cable support surfaces of the associated said cable tray, a plurality of clamping members substantially securing said electrical cables of each cable array against movement relative to the cross supports of the associated cable tray, a ventilation assembly including an air vent shaft providing fluid communication between an exterior and an interior of the enclosure cavity, the cable enclosure and cable raceway section being selected to allow for longitudinal airflow along the interior of the enclosure cavity and into and/or from the air vent shaft.

14. The power distribution system of claim 13, wherein the air vent shaft extends generally vertically from a lower end to an upper end portion in fluid communication with the atmosphere, at least one opening providing fluid communication between said vent shaft and said enclosure cavity.

15. The power distribution system of claim 14, wherein the cable enclosure comprises a subterranean concrete vault, the raceway section being disposed partially in said enclosure cavity with a lowermost one of said cable trays being supported by said enclosure bottom and wherein the vault has a lateral width and/or a vertical height selected less than about 1 meter.

16. The power distribution system as claimed in claim 15, wherein the raceway section includes a ventilated top cover.

17. The power distribution system of claim 15, wherein said opening is spaced vertically a distance above both the bottom of the enclosure cavity and the lower end of the shaft.

18. The power distribution system as claimed in claim 13, wherein the ventilation assembly includes a vent opening fluidically communicating said enclosure cavity with the atmosphere, a fan unit operable to induce air flow into or from said vent opening, and a thermostatic control operable to activate said fan unit when a temperature in the enclosure cavity exceeds a predetermined threshold temperature.

19. The power distribution system as claimed in claim 13, wherein the ventilation assembly provides fluid communication between said enclosure cavity and atmosphere, the ventilation assembly comprising a periscope-type air vent having a vent outlet raised a distance spaced from said enclosure top.

20. The power distribution system as claimed in claim 15, wherein the ventilation assembly includes a vent opening fluidically communicating said enclosure cavity with an outside air source selected from the group consisting of an air conditioned air source and atmosphere,
   a fan unit operable to induce air flow from said air source into the enclosure cavity via the vent opening, and
   a thermostatic control operable to activate said fan unit when a temperature in the cavity exceeds a predetermined threshold temperature.

21. A power distribution system as claimed in claim 13, wherein,
   said clamping members are configured to secure said cables while allowing longitudinal airflow therepast along an interior of said raceway section, and
   said air vent shaft extends generally vertically from a lower end to an upper end portion in fluid communication with the atmosphere, the air vent shaft comprises an offset side aperture open to the enclosure cavity spaced vertically a distance above the lower end of the shaft, the upper end portion extending to a surface grate or periscope-type air vent, and wherein the lower end portion of the air vent shaft configured to allow drainage of water therefrom.

22. The power distribution system of claim 13, wherein the ventilation assembly comprises a plurality of said air vent shafts at locations longitudinally spaced from each other along said enclosure cavity.

23. The power distribution system of claim 22, wherein the air vent shafts include end air vent shafts spaced towards a respective end of the enclosure cavity.

24. The power distribution system of claim 13, wherein the ventilation assembly comprises a plurality of said air vent shafts, at least one said air vent shaft being spaced adjacent an end of the enclosure cavity.

\* \* \* \* \*